US011204829B2

(12) United States Patent
Fu et al.

(10) Patent No.: US 11,204,829 B2
(45) Date of Patent: Dec. 21, 2021

(54) SYSTEMS AND METHODS FOR AN ECC ARCHITECTURE WITH PRIORITIZED TASK QUEUES

(71) Applicant: Innogrit Technologies Co., Ltd., Shanghai (CN)

(72) Inventors: Bo Fu, San Jose, CA (US); Jie Chen, Milpitas, CA (US); Xiaoming Zhu, San Jose, CA (US); Zining Wu, Los Altos, CA (US)

(73) Assignee: INNOGRIT TECHNOLOGIES CO., LTD., Shanghai (CN)

( * ) Notice: Subject to any disclaimer, the term of this patent is extended or adjusted under 35 U.S.C. 154(b) by 198 days.

(21) Appl. No.: 16/364,360

(22) Filed: Mar. 26, 2019

(65) Prior Publication Data
US 2020/0310911 A1    Oct. 1, 2020

(51) Int. Cl.
| | | |
|---|---|---|
| *G06F 11/10* | (2006.01) | |
| *G11C 29/52* | (2006.01) | |
| *G06F 3/06* | (2006.01) | |
| *G06F 11/22* | (2006.01) | |

(52) U.S. Cl.
CPC ........ *G06F 11/1068* (2013.01); *G06F 3/0604* (2013.01); *G06F 3/0659* (2013.01); *G06F 3/0679* (2013.01); *G11C 29/52* (2013.01)

(58) Field of Classification Search
None
See application file for complete search history.

(56) References Cited

U.S. PATENT DOCUMENTS

| | | | | |
|---|---|---|---|---|
| 5,910,921 A | * | 6/1999 | Beffa ................... | G11C 29/44 365/201 |
| 5,968,114 A | * | 10/1999 | Wentka ................. | G06F 9/345 712/E9.039 |
| 2001/0047497 A1 | * | 11/2001 | Larson ................. | G06F 11/106 714/42 |
| 2012/0324449 A1 | * | 12/2012 | Huetter ............... | G06F 9/5066 718/1 |
| 2014/0281050 A1 | * | 9/2014 | Vogan ................. | G06F 3/0611 710/14 |
| 2017/0017544 A1 | * | 1/2017 | Bandic ............... | G06F 11/1068 |
| 2017/0090955 A1 | * | 3/2017 | Hsiao ................. | G06F 11/3476 |
| 2017/0168895 A1 | * | 6/2017 | Fu ........................ | G06F 3/0619 |

OTHER PUBLICATIONS

Li et al., Realizing Unequal Error Correction for NAND Flash Memory at Minimal Read Latency Overhead, IEEE, vol. 61, Issue: 5, Journal Article, pp. 354-358. (Year: 2014).*

* cited by examiner

*Primary Examiner* — April Y Blair
*Assistant Examiner* — Dipakkumar B Gandhi
(74) *Attorney, Agent, or Firm* — IPro, PLLC; Xiaomin Huang

(57) ABSTRACT

Systems, apparatus and methods are provided for an error correction code (ECC) architecture with reduced decoding latency in error control. An apparatus may comprise control circuitry configured to receive a status report that a decoding task has failed, determine that a higher priority is needed for a re-decoding task, generate a NAND read task having a second priority level higher than a first priority level of the failed decoding task, and generate an ECC re-decoding task having the second priority level.

16 Claims, 6 Drawing Sheets

SYSTEMS AND METHODS FOR AN ECC ARCHITECTURE WITH PRIORITIZED TASK QUEUES

TECHNICAL FIELD

The disclosure herein relates to an error correction code (ECC) architecture, particularly relates to an ECC architecture with multiple task queues for tasks having different priorities and a method for reducing decoding latency in a multi-level and multi-round error control scheme.

BACKGROUND

ECC has been widely used in data storage and communication systems such that user data can be recovered by a receiver or reader even when a number of errors (up to the capability of the code being used) were introduced by data corruption in transmission or on a storage. With advancement in the data storage and transmission technology, more data bits are stored and transmitted with higher bit error rates. The higher bit error rates typically result in multiple levels of decoding, multiple round of data retrieval, or both, and generally have a larger decoding latency. Therefore, there is a need in the art for an ECC architecture that reduce latency in multi-level and multi-round error control scheme.

SUMMARY

The disclosed subject matter relates to systems, methods, and devices that provide an ECC architecture with multiple task queues. An ECC architecture implementing the techniques described herein may reduce decoding latency in a multi-level and multi-round error control scheme by assigning tasks different priorities and choosing tasks to execute based on the priorities. In some embodiments, the tasks may be pushed into different queues associated with different priorities and an arbitration rule may be applied such that a higher priority task may be chosen for execution earlier than a lower priority task. Therefore, in a multi-channel NAND storage system that a large number of outstanding tasks may be queued, the decoding latency for error recovery may be reduced by escalating the priority levels of re-decoding tasks such that the re-decoding tasks may be prioritized over any normal or lower priority tasks. In contrast to a tradition approach, in which the re-decoding tasks are mixed with first-decoding tasks, embodiments of the present disclosure provide a fast processing path to re-decoding tasks to reduce latency.

In an exemplary embodiment, there is provided an apparatus that may comprise control circuitry configured to: receive a status report that a decoding task having a first priority level for decoding a codeword has failed, determine that a higher priority is needed for re-decoding the codeword in a next round, generate a NAND read task having a second priority level higher than the first priority level, and generate an ECC re-decoding task having the second priority level.

In another exemplary embodiment, there is provided a method comprising: receiving a status report that a decoding task having a first priority level for decoding a codeword has failed, determining that a higher priority is needed for re-decoding the codeword in a next round, generating a NAND read task having a second priority level higher than the first priority level, and generating an ECC re-decoding task having the second priority level.

Disclosed herein may also include a non-transitory machine-readable medium having executable instructions, wherein the executable instructions, when executed by a hardware controller system, causes the hardware controller system to: receive a status report that a decoding task having a first priority level for decoding a codeword has failed; determine that a higher priority is needed for re-decoding the codeword in a next round; generate a NAND read task having a second priority level higher than the first priority level; and generate an ECC re-decoding task having the second priority level.

DETAILED DESCRIPTION

Figure 1:
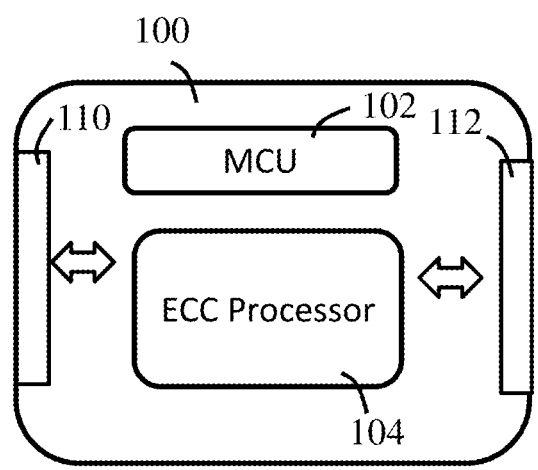
FIG. 1 schematically shows a non-volatile storage controller in accordance with an embodiment of the present disclosure.

Specific embodiments according to the present disclosure will now be described in detail with reference to the accompanying figures. Like elements in the various figures are denoted by like reference numerals for consistency.

The present disclosure provides apparatuses, systems and methods that support various high-speed non-volatile memories (NVMs) and any combination of various NVMs. As used herein, a non-volatile memory device may be a computer storage device that can maintain stored information after being powered off, and the stored information may be retrieved after being power cycled (turned off and back on). Non-volatile storage devices may include floppy disks, hard drives, magnetic tapes, optical discs, NAND flash memories, NOR flash memories, Magnetoresistive Random Access Memory (MRAM), Resistive Random Access Memory (RRAM), Phase Change Random Access Memory (PCRAM), Nano-RAM, etc. In the description, a NAND flash may be used an example for the proposed techniques. However, various embodiments according to the present disclosure may implement the techniques with other kinds of non-volatile storage devices.

FIG. 1 schematically shows an exemplary non-volatile storage controller 100 according to an embodiment. The non-volatile storage controller 100 may comprise a first interface 110, a second interface 112, a microcontroller unit (MCU) 102 and an ECC processor 104. The first interface 110 may be any existing or yet to be developed interface that is configured to couple the non-volatile storage controller 100 to a system bus of a host computing system, and receive data from and transmit data to the host computing system. In one embodiment, for example, the first interface 110 may be an Advanced eXtensible Interface (AXI). The second interface 112 may be any existing or yet to be developed interface that is configured to couple the storage controller 110 to one or more non-volatile storage devices (NVMs). In one embodiment, the second interface 112 may be a multi-channel interface that may be configured to transfer encoded data (e.g., ECC codewords) over multiple channels in parallel. For example, the second interface 112 may be an Open NAND Flash Interface (ONFI) that may support different protocols (e.g., Non-volatile Double Data Rate (NVDDR), NVDDR Type 2 (NVDDR2,) NVDDR Type Three (NVDDR3)), or may be Toggle protocols and run at different transfer speeds.

The MCU 102 may be a computer processor configured to execute executable instructions (e.g., software or firmware). In various embodiments, the MCU 102 may be a microprocessor, a microcontroller, a field-programmable gate array (FPGA), or an application-specific IC (ASIC). The ECC processor 104 may comprise one or more ECC encoders to encode data into codewords to be stored in NVMs and one or more ECC decoders to decode codewords retrieved from the NVMs.

Figure 2A:
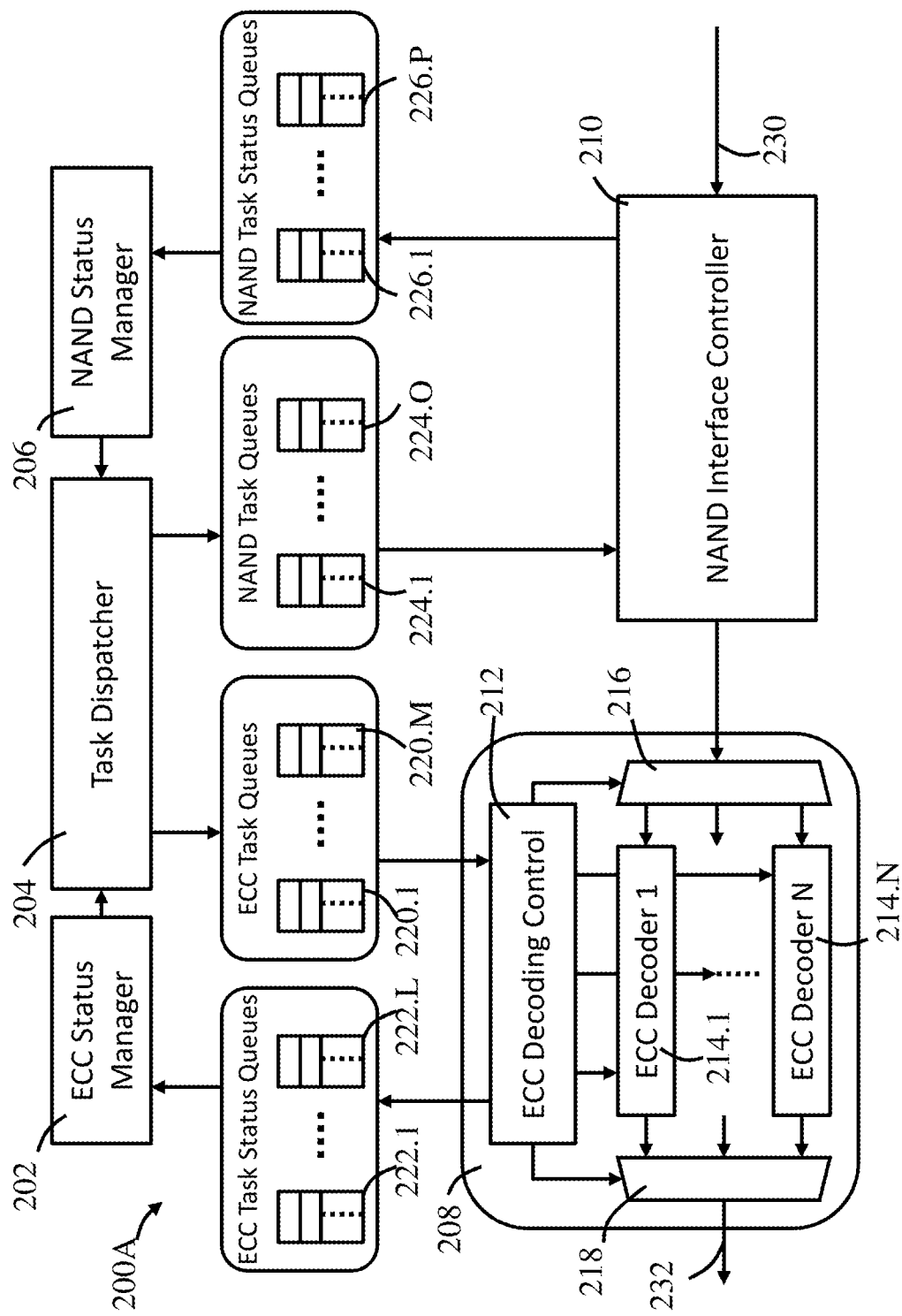
FIG. 2A schematically shows an ECC architecture in accordance with an embodiment of the present disclosure.

FIG. 2A schematically shows an ECC architecture 200A in accordance with an embodiment of the present disclosure. The ECC architecture 200A may comprise an ECC status manager 202, a task dispatcher 204, a NAND status manager 206, an ECC decoder engine 208, a NAND interface controller 210, a plurality of ECC task queues 220.1 through 220.M, a plurality of ECC task status queues 222.1 through 222.L, a plurality of NAND task queues 224.1 through 224.O and a plurality of NAND task status queues 226.1 through 226.P. The ECC decoder engine 208 may comprise an ECC decoding control 212, a plurality of ECC decoders 214.1 through 214.N, an input multiplexer 216 and an output multiplexer 218.

Each of the numbers L, M, O, P and N may denote a positive integer larger than one. The numbers L, M, O, P may indicate the number of priority levels in each type of queues (e.g., the ECC task status queues, ECC task queues, NAND task queues, and NAND task status queues). For example, in an embodiment with L being 2, there may be two ECC task status queues each associated with a different priority level (e.g., normal and high); in another embodiment with L being 3, there may be three ECC task status queues each associated with a different priority level (e.g., low, normal and high). The numbers L, M, O, P may have a same value in one embodiment (e.g., two priority levels in all four types of queues, or three priority levels in all four types of queues). But at least some of the numbers L, M, O, P may have a value different from others in some embodiments. For example, there may be two priority levels of ECC task queues 220.1 through 220.2 and two priority levels of ECC task status queues 222.1 through 222.2, but three priority levels of NAND task queues 224.1 through 224.3 and three priority levels of NAND task status queues 226.1 through 226.3. In an embodiment, the various types of queues may be implemented in a known or yet to be developed hardware queue, such as, but not limited to, circuit registers, shift registers.

The plurality of ECC decoders 214.1 through 214.N may be N decoders that provide different decoding powers. In an embodiment, a more powerful decoding may mean to use one or more different decoders with stronger decoding capabilities or reuse a same decoder with extra soft information. Therefore, in an error control scheme, a codeword failed by a first decoder may be tried again by a more powerful second decoder or by the first decoder with extra soft information retrieved from the NVMs.

The task dispatcher 204 may be configured to control a read operation. For example, when there is a read request for the ECC architecture 200A to read data from NVMs, the task dispatcher 204 may generate a NAND read task, determine a priority level for the NAND read task (e.g., based on the read request's priority) and push it into one of the plurality of NAND task queues 224.1 through 224.O depending on the priority level of the NAND read task. In an embodiment, the NAND read task may be assigned a task identifier (e.g., task ID).

The NAND interface controller 210 may receive the NAND read tasks from the NAND task queues 224.1 through 224.O and execute the tasks to read data from NVMs via an input 230 coupled to the NVMs. One or more of a set of arbitration rules may be implemented (e.g., by the NAND interface controller 210) to select a NAND task for executing when there may be multiple tasks to choose from. The set of arbitration rules may include round-robin, weighted round-robin, priority or a combination of them. For example, in a round-robin based selection, the tasks may be selected one at a time from each of the plurality of NAND task queues 224.1 through 224.O in turn; in a weighted round-robin based selection, the tasks may be selected from each of the plurality of NAND task queues 224.1 through 224.O in turn but given each queue different weight (e.g., two tasks from a task queue associated with a higher priority level and one task from a task queue associated with a lower priority level in one round); and in a priority-based selection, the tasks in a higher priority level queue of the plurality of NAND task queues 224.1 through 224.O may be prioritized to be executed by the NAND interface controller 210 before all task in lower priority level task queues.

The completion order of the NAND tasks may not be guaranteed to be the same as NAND tasks' starting order. In one embodiment, for example, a priority-based arbitration may be implemented in which a first NAND read task in a high priority NAND task queue may be executed before a second NAND read task in a normal priority NAND task queue. The second NAND read task may be started later than the first NAND read task by the NAND interface controller 210 but may be finished earlier. The NAND interface controller 210 may be configured to generate a task complete status report and send the task complete status report to one of the plurality of NAND task status queues 226.1 and 226.P according to the priority level of the NAND read task whenever a NAND read task has finished and data (e.g., one or more codewords) has been received by the NAND interface controller 210. For example, in an embodiment that the number of NAND task status queues may match the number of NAND task queues (e.g., the number O is equal to the number P), the NAND interface controller 210 may send a status report to the normal priority NAND task status queue when the second NAND read task is completed and send a status report to the high priority NAND task status queue when the first NAND read task is completed. In an embodiment, the task status report may include the task identifier associated with the task.

The NAND status manager 206 may be configured to monitor the NAND task status queues 226.1 through 226.P and report the completion of NAND tasks to the task dispatcher 204. Once a NAND read task is completed, data retrieved from the NVMs may be ready for decoding. The task dispatcher 204 may generate an ECC decoding task, determine the decoding task's priority and pushed the decoding task into one of the plurality of ECC task queues 220.1 through 220.M based on the priority level of the ECC decoding task. In an embodiment, the same task identifier associated with the NAND read task may be reused for the ECC decoding task but this may be optional. The ECC decoding control 212 may receive the ECC decoding tasks from the plurality of ECC task queues 220.1 through 220.M and select one the plurality of ECC decoders 214.1 through 214.N to perform the decoding operation. One or more of a set of arbitration rules may be implemented (e.g., by the ECC decoding control 212) to select an ECC decoding task for executing when there may be multiple tasks to choose from. The arbitration rules may include round-robin, weighted round-robin, priority or a combination of them similar to those that may be implemented for choosing NAND tasks for executing. A control signal may be generated by the ECC decoding control 212 and sent to the input multiplexer 216 so that a codeword read from the NVMs may be routed to the selected ECC decoder.

The selected ECC decoder may either successfully decode the codeword or fail to decode the codeword. If the codeword is successfully decoded, the decoding task is completed successfully and a decoding success signal may be generated by the ECC decoding control 212 and pushed into one of the ECC task status queues 222.1 through 222.L. At the same time, the ECC decoding control 212 may send a signal to the decoder output multiplexer 232 so that the decoded data may be output from the decoder engine 208. If the codeword fails to be decoded successfully, the decoding task has failed and a decoding failure signal may be generated by the ECC decoding control 212 and pushed into one of the ECC task status queues 222.1 through 222.L.

In one embodiment, one decoder may take longer time than another decoder to complete a decoding task regardless whether the decoding operation is a success or failure. For example, the ECC decoder 214.1 may start a decoding operation for a first decoding task later than the ECC decoder 214.2 starting a decoding operation for a second decoding task but the ECC decoder 214.1 may finish its decoding operation earlier. If the first decoding task and the second decoding task have a same priority level, the status signals for the first decoding task and the second decoding task may be queued in the same ECC task status queue with the earlier status signal in front of the later status signal. If the first decoding task and the second decoding task have different priority levels, the status signals for the first decoding task and the second decoding task may be queued in separate ECC task status queues with corresponding priority levels. In one embodiment, an error control scheme may raise (e.g., escalate) the priority level of a decoding failure signal such that the priority level of the status is higher than the priority level of the decoding task itself. For example, when a normal priority level decoding task is successfully decoded, the decoding success signal may be sent to a normal priority level ECC task status queue but when the normal priority level decoding task fails to decode successfully, the decoding failure signal may be sent to a high priority level ECC task status queue.

The ECC status manager 202 may be configured to monitor the ECC task status queues 222.1 through 222.L and report the completion of ECC tasks to the task dispatcher 204. In an embodiment that decoding failures may be reported on an ECC task status queue with a high priority level, the ECC status manager 202 may receive a decoding failure signal earlier than a decoding success signal even though the decoding success signal may have been generated by the ECC decoding control 212 and sent to a low or normal priority level ECC task status queue earlier.

In some embodiments, the ECC architecture 200A may implement a multi-level and multi-round error control scheme such that if a codeword fails to be decoded in a first decoding attempt, a fast processing path may be provided to a re-decoding task. In an embodiment, for example, the decoding failure of a codeword may be reported by the ECC decoding control 212 to a high priority ECC task status queue 222 to the ECC status manager 202. The task dispatcher 204 may be configured to generate a NAND re-read task with a high priority and send the re-read task to a high priority NAND task queue 224. The NAND interface controller 210 may be configured to report the status of the NAND re-read task to a high priority NAND task status queue 226. The task dispatcher 204 may be further configured to generate a re-decoding task for the codeword with a high priority and send the re-decoding task to a high priority ECC task queue 220. The normal priority and high priority are just an example. In an embodiment, there may be more than two priority levels and a re-decoding task may be escalated into a priority level higher than the decoding task in a preceding decoding attempt. Moreover, in an embodiment, a same task identifier may be used in multiple rounds of a decoding process. Therefore, the fast processing path may reduce latency in a multi-level and multi-round error control process. It should be noted that in various embodiments, different rules may be used to change the priority of re-decoding tasks, for example, one rule may always increase the priority level of re-decoding task every round until a highest priority level is reached, another rule may only increase the priority level of re-decoding task if necessary.

Figure 2B:
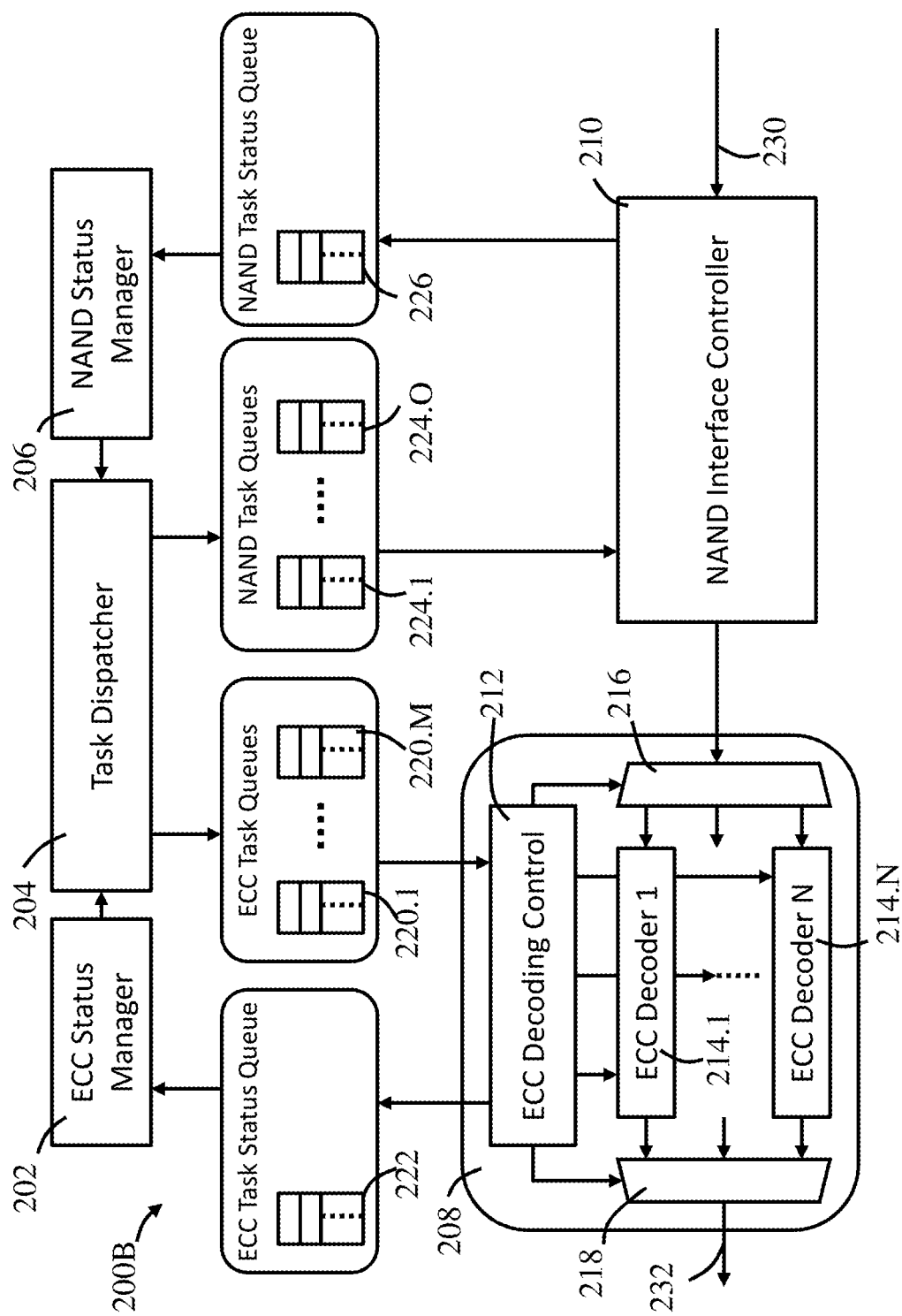
FIG. 2B schematically shows an ECC architecture in accordance with another embodiment of the present disclosure.

FIG. 2B schematically shows an ECC architecture 200B in accordance with another embodiment of the present disclosure. In comparison to the ECC architecture 200A, the ECC architecture 200B may comprise one NAND task status queue 226 and one ECC task status queue 222. Therefore, once any NAND read task completes its read operation and the data has been retrieved from the NVMs for the read task, the NAND interface controller 210 may push the task status to the same NAND task status queue 226. And once any ECC decoding/re-decoding task is finished (e.g., either successful or failed), ECC decoding control 221 may push the task status to the same ECC task status queue 222. Therefore, in an embodiment of the ECC architecture 200B, the task status information is not sent in separate status queues associated with different priority levels while NAND tasks and ECC decoding/re-decoding tasks may be pushed into task queues associated with different priority levels. In such an embodiment, the task status information may include the task identifier and the task's priority level and the ECC status manager 202 and the NAND status manager 206 may give priority to the task status reports of tasks having higher priority.

In some embodiments, the various components of the ECC architecture 200A and ECC architecture 200B may be implemented in hardware circuit blocks. For example, the ECC status manger 202, the task dispatcher 204, the NAND status manager 206 may be implemented in FPGA, ASIC, or a combination of FPGA and ASIC. And the NAND read tasks, ECC decoding or re-decoding tasks may be generated by hardware. In some other embodiments, at least some of the components of the ECC architecture 200A and ECC architecture 200B may be implemented by a computer processor executing executable instructions. For example, in an embodiment, any or all of the ECC status manger 202, the task dispatcher 204, the NAND status manager 206 may be implemented by the MCU 102 executing software or firmware executable instructions. And the NAND read tasks, ECC decoding or re-decoding tasks may be generated by a processor executing executable instructions. In an embodiment, the ECC status manger 202, the task dispatcher 204, the NAND status manager 206, the ECC decoding control 212, the NAND interface controller 210 and the MCU 102 may be collectively referred to as control circuitry.

Figure 3:
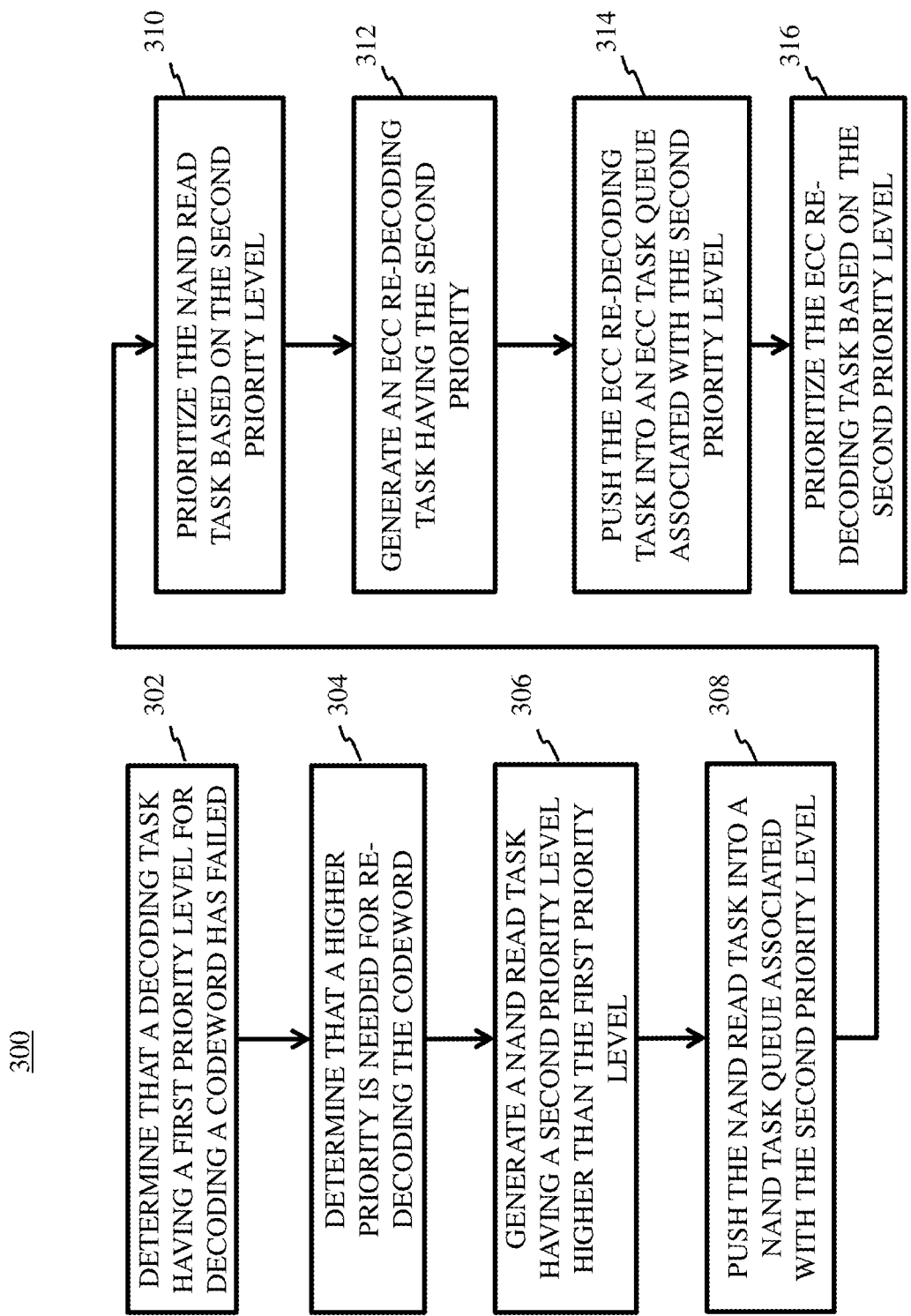
FIG. 3 is a flowchart of an error control process in accordance with an embodiment of the present disclosure.

FIG. 3 is a flowchart of an error control process 300 in accordance with an embodiment of the present disclosure. At block 302, a status report indicating a decoding task has failed may be received. For example, a decoding task having a first priority level executed by one of the plurality of ECC decoders 214.1 through 214.N to decode a codeword may fail to decode the codeword and the ECC decoding control 212 may be configured to push the failure status that the decoding task has failed to an ECC task status queue. At block 304, whether a higher priority is needed for re-decoding the codeword may be determined. For example, when a codeword has failed in a decoding task, the task dispatcher 204 may be configured to determine that a re-decoding task with an escalated priority level may be needed for the re-trying task. At block 306, a NAND read task with a second priority level that is higher than the first priority level may be generated. For example, the task dispatcher 204 may generate the NAND read task with an escalated priority level. In an embodiment, the NAND read task may try to retrieve more information about the codeword, for example, extra information for soft decision decoding. At block 308, the NAND read task may be pushed into a NAND task queue associated with the second priority level. The plurality of NAND task queues 224.1 through 224.O may be associated with different priority levels such that one of the task queues may be associated with the escalated priority level to hold the generated NAND read task.

At block 310, the NAND read task may be prioritized based on the second priority level. For example, the tasks in the plurality of NAND task queues 224.1 through 224.O may be selected for execution by the NAND interface controller 210 based on an arbitration rule (e.g., a priority-based selection or weighted round-robin selection) such that tasks with higher priority levels may be chosen and started earlier than tasks with lower priority levels. At block 312, an ECC re-decoding task having the second priority may be generated. At block 314, the ECC re-decoding task may be pushed into an ECC task queue associated with the second priority level. For example, once the NAND read task has been completed by the NAND interface controller 210 and the data retrieved from the NVMs may be ready for further processing, a task status report may be sent to a task status queue. The NAND status manager 206 may report the status update for the NAND read task to the task dispatcher 204 and the task dispatcher 204 may generate the ECC re-decoding task with the escalated higher priority level.

At block 316, the ECC re-decoding task may be prioritized based on the higher priority. For example, the ECC re-decoding task may be sent to an ECC task queue with a corresponding higher priority and may be selected by the ECC decoding control 212 for execution according to an arbitration rule (e.g., a priority-based selection or weighted round-robin selection) such that tasks with higher priority levels may be chosen and started earlier than tasks with lower priority levels. In an embodiment, the re-decoding task may be assigned to the decoder that fails the first decoding attempt for a more powerful retry. In another embodiment, the re-decoding task may be assigned to another decoder that may be more powerful than the decoder that fails the first decoding attempt.

Figures 4, 5:
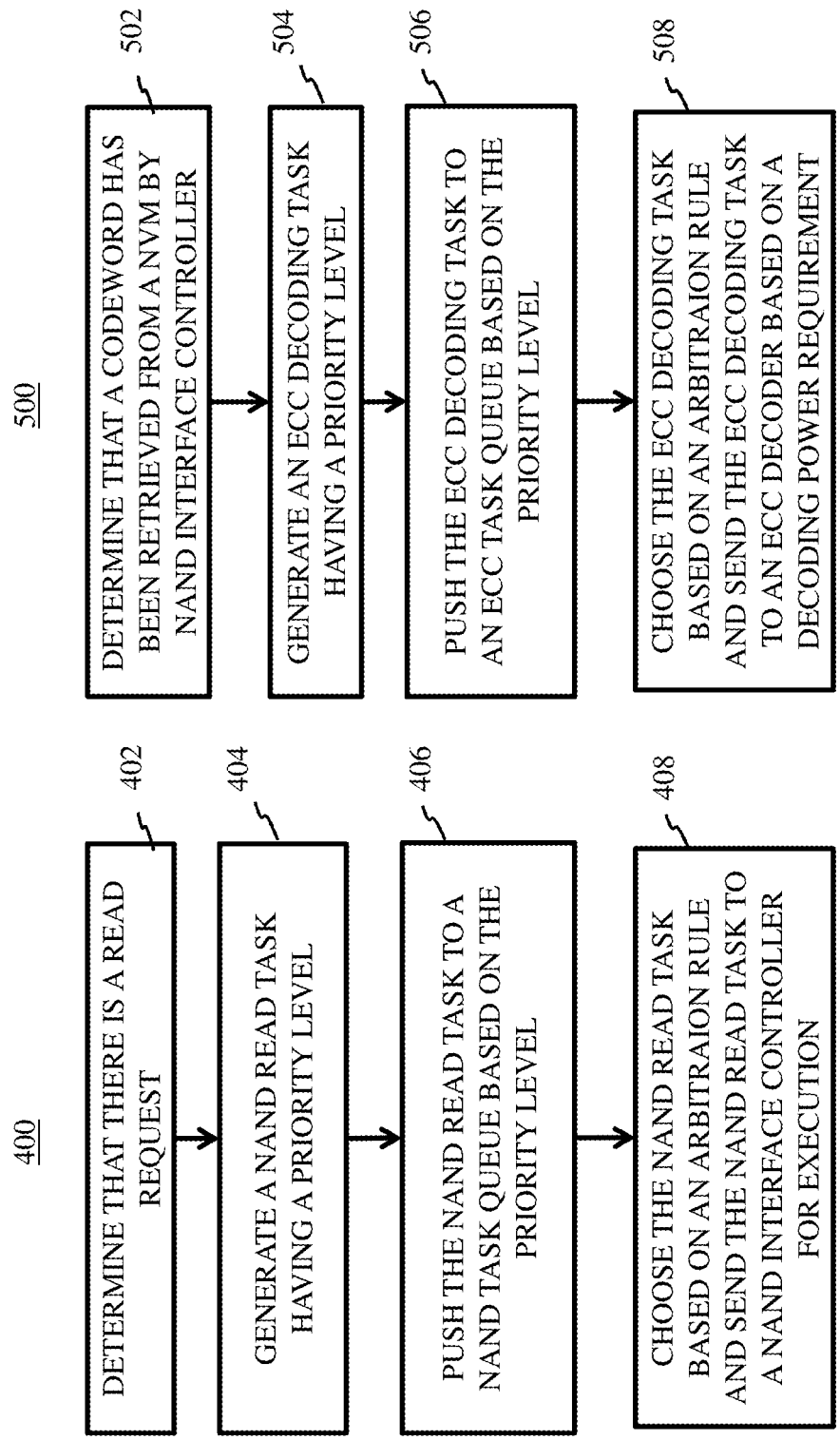
FIG. 4 is a flowchart of executing a NAND read task in accordance with an embodiment of the present disclosure.
FIG. 5 is a flowchart of executing an ECC decoding task in accordance with an embodiment of the present disclosure.

FIG. 4 is a flowchart of a process 400 for executing a NAND read task in accordance with an embodiment of the present disclosure. At block 402, whether there is a read request may be determined. For example, a read request may come from a host coupled to a NAND storage system, or generated within the NAND storage system (e.g., for garbage collection). In an embodiment, the read request may be assigned a priority based on whether it's from the host or generated within the NAND storage system. At block 404, a NAND read task may be generated and the NAND read task may be assigned a specific priority level. At block 406, the NAND read task may be pushed to a NAND task queue based on the priority level. At block 408, the NAND read task may be chosen based on an arbitration rule and sent to a NAND interface controller for execution. The arbitration rule may be round-robin, weighted round-robin, priority, or combination of them.

FIG. 5 is a flowchart of a process 500 for executing an ECC decoding task in accordance with an embodiment of the present disclosure. At block 502, it may be determined that a codeword has been retrieved from a NVM by the NAND interface controller. For example, when a NAND read task has been completed by the NAND interface controller 210, a status report may be pushed into a NAND task status queue 226 and the task dispatcher 204 may obtain the NAND task completion status from the NAND status manager 206. At block 504, an ECC decoding task may be generated and assigned a priority level. In an embodiment, the ECC decoding task may reuse the task identifier assigned to the NAND read task that retrieves the codeword from the NVM. Moreover, the priority level may also be the same priority level for the NAND read task. At block 506, the ECC decoding task may be pushed to an ECC task queue based on the priority level. At block 508, the ECC decoding task may be chosen based on an arbitration rule and sent to an ECC decoding control for execution. The arbitration rule may be round-robin, weighted round-robin, priority, or combination of them. In an embodiment, the ECC decoding control 212 may select an ECC decoder from a plurality of ECC decoders 214.1 through 214.N to decode the codeword based on a decoding power requirement.

Figure 6:
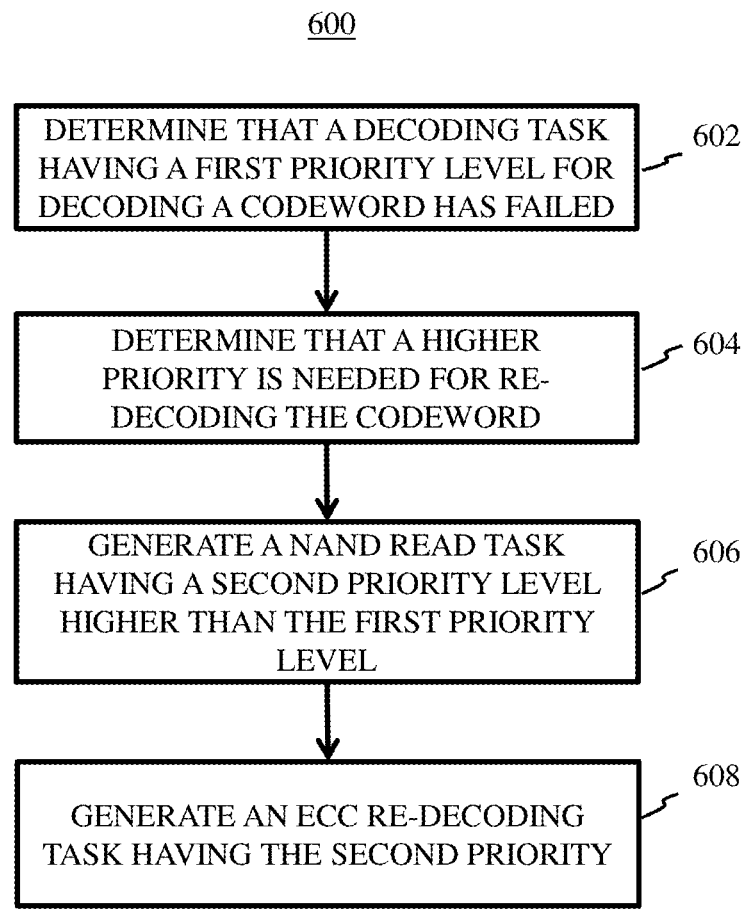
FIG. 6 is a flowchart of an error control process in accordance with another embodiment of the present disclosure.

FIG. 6 is a flowchart of an error control process 600 in accordance with another embodiment of the present disclosure. At block 602, a status report indicating a decoding task has failed may be received. For example, a decoding task having a first priority level executed by one of the plurality of ECC decoders 214.1 through 214.N to decode a codeword may fail to decode the codeword and the ECC decoding control 212 may be configured to push the failure status that the decoding task has failed to an ECC task status queue. At block 604, whether a higher priority is needed for re-decoding the codeword may be determined. For example, when a codeword has failed in a decoding task, the task dispatcher 204 may be configured to determine that a re-decoding task with an escalated priority level may be needed for the re-trying task. At block 606, a NAND read task with a second priority level that is higher than the first priority level may be generated. For example, the task dispatcher 204 may generate the NAND read task with an escalated priority level. In an embodiment, the NAND read task may try to retrieve more information about the codeword, for example, extra information for soft decision decoding.

In an embodiment that has implemented the plurality of NAND task queues 224.1 through 224.O, the NAND read task to be pushed into a NAND task queue associated with the second priority level and the NAND read task may be prioritized based on the second priority level.

At block 608, an ECC re-decoding task having the second priority may be generated. In an embodiment that has implemented the ECC task queues 220.1 through 220.M, the ECC re-decoding task may be pushed into an ECC task queue associated with the second priority level and the ECC re-decoding task may be prioritized based on the higher priority.

In various embodiments, each of the processes 300, 400, 500 and 600 may have one or more portions or in its entirety be implemented using hardware (e.g., a field-programmable gate array (FPGA) or an application-specific IC (ASIC)), firmware, a computer processor executing software instructions, or any suitable combination.

Embodiments of the present disclosure may comprise a plurality of ECC Decoder 1 to Decoder N that provide different decoding powers, with N being an integer larger than one. In an embodiment, more powerful decoding scheme may mean to use a different decoder or reuse the same decoder with extra soft-information. Therefore, a codeword fails to be decoded by one decoder may have one or more rounds of re-decoding process in an error control scheme. The re-decoding task may be generated by hardware or software. Arbitration scheme to choose a task for execution may be round-robin, weighed round-robin, priority or a combination of them. Moreover, different rules may be used to change the priority of re-decoding task, for example, always increase the priority of re-decoding task every round until highest priority is reached, or only increase the priority of re-decoding task when it is necessary.

In an exemplary embodiment, there is provided an apparatus that may comprise control circuitry configured to: receive a status report that a decoding task having a first priority level for decoding a codeword has failed, determine that a higher priority is needed for re-decoding the codeword in a next round, generate a NAND read task having a second priority level higher than the first priority level, and generate an ECC re-decoding task having the second priority level.

In an embodiment, the apparatus may further comprise a plurality of NAND task queues associated with different priority levels and a plurality of Error Correction Code (ECC) task queues associated with different priority levels. The control circuitry may be further configured to: push the NAND read task into one of the plurality of NAND task queues associated with the second priority level; prioritize the NAND read task based on the second priority level; push the ECC re-decoding task into one of the plurality of ECC task queues associated with the second priority level; and prioritize the ECC re-decoding task based on the second priority level.

In an embodiment, the apparatus may further comprise a plurality of ECC decoders, and the control circuitry may be further configured to select one ECC decoder from the plurality of ECC decoders to decode the codeword.

In an embodiment, the plurality of ECC decoders may include at least a first decoder and a second decoder, the second decoder may be more powerful than the first decoder, and the control circuitry may be further configured to select the first decoder for the decoding task and the second decoder for the ECC re-decoding task.

In an embodiment, the apparatus may further comprise an ECC task status queue, and the control circuitry may be further configured to generate a failure status report when the decoding task fails and push the failure status report to the ECC task status queue.

In an embodiment, the apparatus may further comprise a plurality of ECC task status queues associated with different priority levels, and the control circuitry may be further configured to generate a failure status report when the decoding task fails and push the failure status report to one of the plurality of ECC task status queues that has the second priority level.

In an embodiment, to prioritize the NAND read task and prioritize the ECC re-decoding task may include applying an arbitration rule that is one of weighted round-robin or priority.

In an embodiment, the apparatus may further comprise an ECC status manager configured to monitor ECC task status, a NAND status manager configured to monitor NAND task status, and a task dispatcher coupled to the ECC status manager and NAND status manager and configured to generate NAND tasks and ECC decoding and re-decoding tasks.

In an embodiment, each of the NAND tasks and each of the ECC decoding and re-decoding tasks may have a priority level respectively, and the NAND tasks and the ECC decoding and re-decoding tasks may be pushed to a plurality of NAND task queues and a plurality of ECC task queues according to their respective priority levels.

In an embodiment, the control circuitry may comprise a computer processor configured to execute software instructions to: monitor ECC task status; monitor NAND task status, and generate NAND tasks and ECC decoding and re-decoding tasks.

In an embodiment, each of the NAND tasks and each of the ECC decoding and re-decoding tasks may have a priority level respectively, and the NAND tasks and the ECC decoding and re-decoding tasks may be pushed to a plurality of NAND task queues and a plurality of ECC task queues according to their respective priority levels.

In another exemplary embodiment, there is provided a method comprising: receiving a status report that a decoding task having a first priority level for decoding a codeword has failed, determining that a higher priority is needed for re-decoding the codeword in a next round, generating a NAND read task having a second priority level higher than the first priority level, and generating an ECC re-decoding task having the second priority level.

In an embodiment, the method may further comprise: pushing the NAND read task into a NAND task queue associated with the second priority level; prioritizing the NAND read task based on the second priority level; pushing the ECC re-decoding task into an ECC task queue associated with the second priority level; and prioritizing the ECC re-decoding task based on the second priority level.

In an embodiment, the method may further comprise selecting an ECC decoder from a plurality of ECC decoders to decode the codeword.

In an embodiment, the decoding task may be performed using a first ECC decoder and the re-decoding task may be perform using a second decoder, and the second decoder may be more powerful than the first decoder.

In an embodiment, the method may further comprise generating a failure status report when the decoding task fails and push the failure status report to an ECC task status queue.

In an embodiment, the method may further comprise generating a failure status report when the decoding task fails and push the failure status report to one of a plurality of ECC task status queues associated with the second priority level. The plurality of ECC task status queues may each be associated with a different priority level.

In an embodiment, the method may further comprise applying an arbitration rule that may be one of weighted round-robin or priority to prioritize the NAND read task and the ECC re-decoding task.

In an embodiment, the method may further comprise monitoring ECC task status; monitoring NAND task status, and generate NAND tasks and ECC decoding and re-decoding tasks based on collected NAND task status or ECC task status.

In an embodiment, each of the NAND tasks and each of the ECC decoding and re-decoding tasks may have a priority level respectively, and the NAND tasks and the ECC decoding and re-decoding tasks may be pushed to a plurality of NAND task queues and a plurality of ECC task queues according to their respective priority levels.

Disclosed herein may also include a non-transitory machine-readable medium having executable instructions, that the executable instructions, when executed by a hardware controller system, may cause the hardware controller system to: receive a status report that a decoding task having a first priority level for decoding a codeword has failed; determine that a higher priority is needed for re-decoding the codeword in a next round; generate a NAND read task having a second priority level higher than the first priority level; and generate an ECC re-decoding task having the second priority level.

In an embodiment, the executable instructions, when executed by the hardware controller system, may further cause the hardware controller system to push the NAND read task into one of a plurality of NAND task queues associated with the second priority level; prioritize the NAND read task based on the second priority level; push the ECC re-decoding task into one of a plurality of ECC task queues associated with the second priority level; and prioritize the ECC re-decoding task based on the second priority level.

In an embodiment, the executable instructions, when executed by the hardware controller system, may further cause the hardware controller system to apply an arbitration rule that may be one of weighted round-robin or priority to prioritize the NAND read task and the ECC re-decoding task.

Any of the disclosed methods and operations may be implemented as computer-executable instructions (e.g., software code for the operations described herein) stored on one or more computer-readable storage media (e.g., non-transitory computer-readable media, such as one or more optical media discs, volatile memory components (such as DRAM or SRAM), or nonvolatile memory components (such as SSD hard drives)) and executed on a device controller (e.g., firmware executed by ASIC). Any of the computer-executable instructions for implementing the disclosed techniques as well as any data created and used during implementation of the disclosed embodiments can be stored on one or more computer-readable media (e.g., non-transitory computer-readable media).

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:

1. An apparatus, comprising:
a plurality of NAND flash memory (NAND) task queues associated with different priority levels;
at least one NAND task status queue;
a plurality of Error Correction Code (ECC) task queues associated with different priority levels; and
control circuitry comprising:
an ECC status manager configured to monitor ECC task status;
a NAND status manager configured to monitor NAND task status; and
a task dispatcher coupled to the ECC status manager and NAND status manager and configured to:
receive a status report via the ECC status manager that a decoding task having a first priority level for decoding a codeword has failed;
determine that a higher priority is needed for re-decoding the codeword in a next round;
generate a NAND read task having a second priority level higher than the first priority level;
push the NAND read task into one of the plurality of NAND task queues associated with the second priority level;
receive a NAND read complete status report via the NAND status manager that the NAND read task having the second priority level has finished;
generate an ECC re-decoding task having the second priority level; and
push the ECC re-decoding task into one of the plurality of ECC task queues associated with the second priority level, wherein the at least one NAND task status queue is coupled between the NAND status manager and a NAND interface controller, and the NAND interface controller is configured to generate the NAND read complete status report when the NAND read task having the second priority level has finished and push the NAND read complete status report to the at least one NAND task status queue.

2. The apparatus of claim 1, further comprising a plurality of ECC decoders, wherein the control circuitry is further configured to select one ECC decoder from the plurality of ECC decoders to decode the codeword.

3. The apparatus of claim 2, wherein the plurality of ECC decoders include at least a first decoder and a second decoder, the second decoder is more powerful than the first decoder, and the control circuitry is further configured to select the first decoder for the decoding task and the second decoder for the ECC re-decoding task.

4. The apparatus of claim 1, further comprising an ECC task status queue coupled to the ECC status manager, wherein the control circuitry further comprises an ECC decoding control that is configured to generate a failure status report when the decoding task fails and push the failure status report to the ECC task status queue.

5. The apparatus of claim 1, further comprising a plurality of ECC task status queues associated with different priority levels and coupled to the ECC status manager, wherein the control circuitry further comprises an ECC decoding control that is configured to generate a failure status report when the decoding task fails and push the failure status report to one of the plurality of ECC task status queues that has the second priority level.

6. The apparatus of claim 1, wherein the task dispatcher is further configured to prioritize the NAND read task and prioritize the ECC re-decoding task include applying an arbitration rule that is one of weighted round-robin or priority.

7. The apparatus of claim 1, wherein the task dispatcher is configured to generate NAND tasks and ECC decoding and re-decoding tasks, and each of the NAND tasks and each of the ECC decoding and re-decoding tasks have a priority level respectively, and the NAND tasks and the ECC decoding and re-decoding tasks are pushed to the plurality of NAND task queues and the plurality of ECC task queues according to their respective priority levels.

8. A method, comprising:
receiving, at a task dispatcher via an Error Correction Code (ECC) status manager, a status report that a decoding task having a first priority level for decoding a codeword has failed;
determining, by the task dispatcher, that a higher priority is needed for re-decoding the codeword in a next round;
generating, by the task dispatcher, a NAND flash memory (NAND) read task having a second priority level higher than the first priority level;
pushing, by the task dispatcher, the NAND read task into one of a plurality of NAND task queues associated with the second priority level;
generating, by a NAND interface controller, a NAND read complete status report when the NAND read task having the second priority level has finished;
pushing the NAND read complete status report to at least one NAND task status queue coupled between a NAND status manager and the NAND interface controller;
receiving, by the task dispatcher via the NAND status manager, the NAND read complete status report;
generating, by the task dispatcher, an ECC re-decoding task having the second priority level; and
pushing, by the task dispatcher, the ECC re-decoding task into one of a plurality of ECC task queues associated with the second priority level.

9. The method of claim 8, further comprising selecting an ECC decoder from a plurality of ECC decoders to decode the codeword.

10. The method of claim 8, wherein the decoding task is performed using a first ECC decoder and the re-decoding task is performed using a second decoder, and the second decoder is more powerful than the first ECC decoder.

11. The method of claim 8, further comprising generating a failure status report when the decoding task fails and push the failure status report to an ECC task status queue.

12. The method of claim 8, further comprising generating a failure status report when the decoding task fails and push the failure status report to one of a plurality of ECC task status queues associated with the second priority level, the plurality of ECC task status queues each associated with a different priority level.

13. The method of claim 8, further comprising applying an arbitration rule that is one of weighted round-robin or priority to prioritize the NAND read task and the ECC re-decoding task.

14. The method of claim 8, further comprising generating NAND tasks and ECC decoding and re-decoding tasks based on collected ECC task status or NAND task status, wherein each of the NAND tasks and each of the ECC decoding and re-decoding tasks have a priority level respectively, and the NAND tasks and the ECC decoding and re-decoding tasks are pushed to the plurality of NAND task queues and the plurality of ECC task queues according to their respective priority levels.

15. A non-transitory machine-readable medium having executable instructions, wherein the executable instructions, when executed by a hardware controller system, causes the hardware controller system to:
receive, at a task dispatcher via an Error Correction Code (ECC) status manager, a status report that a decoding task having a first priority level for decoding a codeword has failed;
determine, by the task dispatcher, that a higher priority is needed for re-decoding the codeword in a next round;
generate, by the task dispatcher, a NAND flash memory (NAND) read task having a second priority level higher than the first priority level;
push, by the task dispatcher, the NAND read task into one of a plurality of NAND task queues associated with the second priority level;
generate, a NAND interface controller, a NAND read complete status report when the NAND read task having the second priority level has finished;
push the NAND read complete status report to a NAND task status queue;
receive, by the task dispatcher, the NAND read complete status report via a NAND status manager;
generate, by the task dispatcher, an ECC re-decoding task having the second priority level; and
push, by the task dispatcher, the ECC re-decoding task into one of a plurality of ECC task queues associated with the second priority level.

16. The non-transitory machine-readable medium of claim 15, wherein the executable instructions, when executed by the hardware controller system, further causes the hardware controller system to apply an arbitration rule that is one of weighted round-robin or priority to prioritize the NAND read task and the ECC re-decoding task.

* * * * *